US007460841B2

(12) United States Patent
Fischer et al.

(10) Patent No.: US 7,460,841 B2

(45) Date of Patent: Dec. 2, 2008

(54) CIRCUIT ARRANGEMENT AND METHOD FOR COMPENSATING FOR ABRUPT SIGNAL LEVEL CHANGES IN AMPLIFICATION DEVICES

(75) Inventors: Frank Fischer, München (DE); Horst Klein, Markt Schwaben (DE); Erwin Krug, München (DE); Bernd Pflaum, Unterhaching (DE)

(73) Assignee: Infineon Technologies AG, Munich (DE)

( * ) Notice: Subject to any disclaimer, the term of this patent is extended or adjusted under 35 U.S.C. 154(b) by 459 days.

(21) Appl. No.: 11/214,325

(22) Filed: Aug. 29, 2005

(65) Prior Publication Data

US 2006/0194555 A1 Aug. 31, 2006

Related U.S. Application Data

(63) Continuation of application No. PCT/DE2004/000370, filed on Feb. 27, 2004.

(30) Foreign Application Priority Data

Feb. 28, 2003 (DE) ................................ 103 08 923

(51) Int. Cl.
*H04B 1/04* (2006.01)

(52) U.S. Cl. .............. 455/127.1; 455/127.2; 455/127.3; 455/250.1; 455/253.2; 455/246.1; 370/313; 370/252; 375/146; 375/147

(58) Field of Classification Search .............. 455/127.1, 455/127.2, 127.3, 250.1, 253.2, 241.1, 245.1, 455/246.1; 370/313, 252; 375/146, 147
See application file for complete search history.

(56) References Cited

U.S. PATENT DOCUMENTS

| | | | | |
|---|---|---|---|---|
| 5,193,223 | A | 3/1993 | Walczak et al. | |
| 5,287,555 | A * | 2/1994 | Wilson et al. | 455/115.1 |
| 5,745,480 | A * | 4/1998 | Behtash et al. | 370/252 |
| 6,118,988 | A | 9/2000 | Choi | |
| 6,370,203 | B1 | 4/2002 | Boesch et al. | |
| 6,728,224 | B1 * | 4/2004 | Kakizaki et al. | 370/313 |
| 2001/0028244 | A1 | 10/2001 | Bhat | |

FOREIGN PATENT DOCUMENTS

| | | | |
|---|---|---|---|
| DE | 100 25 837 | A1 | 12/2001 |
| EP | 1 026 833 | A2 | 8/2000 |
| WO | WO 02/37673 | A1 | 5/2002 |

OTHER PUBLICATIONS

International Search Report, Int'l Application No. PCT/DE2004/000370, Int'l Filing Date Feb. 27, 2004, 3 pgs.

* cited by examiner

*Primary Examiner*—Sanh D Phu
(74) *Attorney, Agent, or Firm*—Eschweiler & Associates, LLC

(57) ABSTRACT

A circuit arrangement includes two adjustable amplification devices where the signal output of the first amplification device is connected to the signal input of the second amplification device. The first amplification device has a digital input for controlling its gain and the second amplification device has an input for controlling its gain. The input for gain control in the second amplification device is connected to the input for controlling the gain of the first amplification device via a means such that a change in the gain of the second amplification device in one direction is effected by a change in gain, brought about by means of the control, in the first amplification device in the opposite direction such that the total gain remains essentially the same.

13 Claims, 1 Drawing Sheet

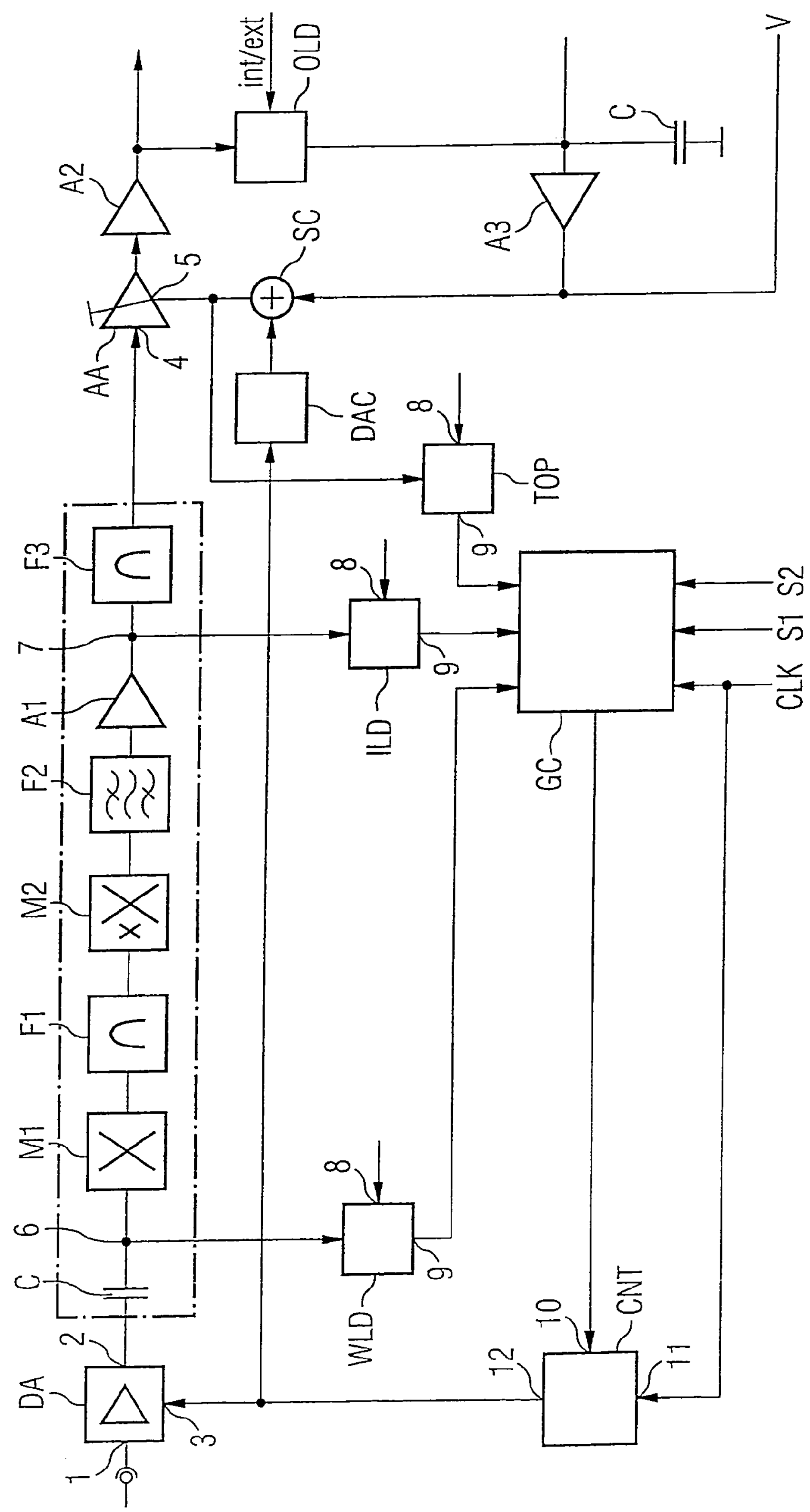
int/ext
OLD
C
V
A2
SC
5
A3
AA
4
DAC
8
TOP
F3
8
9
7
A1
9
ILD
F2
GC
S2
S1
CLK
M2
F1
M1
8
6
C
9
WLD
10
CNT
2
DA
12
11
1
3

CIRCUIT ARRANGEMENT AND METHOD FOR COMPENSATING FOR ABRUPT SIGNAL LEVEL CHANGES IN AMPLIFICATION DEVICES

REFERENCE TO RELATED APPLICATIONS

This application is a continuation of PCT/DE2004/000370, filed Feb. 27, 2004 which was not published in English, that claims the benefit of the priority date of German Patent Application No. DE 103 08 923.3, filed on Feb. 28, 2003, the contents of which both are herein incorporated by reference in their entireties.

FIELD OF THE INVENTION

The present invention relates to a circuit arrangement comprising two adjustable amplification devices in which the signal output of the first amplification device is connected to the signal input of the second amplification device.

BACKGROUND OF THE INVENTION

To be able to process low-power, received radio signals, for example broadcast radio or television signals, the signals are amplified by a low-noise input amplifier in order to obtain a good signal-to-noise ratio. The low-noise input amplifier (low noise amplifier) is additionally of very wideband design in order to be able to detect all of the signals which are in the useful range. After that, the amplified signal, which is at an RF frequency, is converted to an intermediate frequency so as to be processed further at this frequency. Following the frequency conversion, the actual more narrowband useful signal is selected by filters and in this context is attenuated again. The attenuation brought about through frequency conversion and through filtering is compensated for by a second and possibly a third amplifier.

Amplification devices of this type, which are used primarily in television systems, therefore require both a low noise factor and a large signal strength in order to reduce unwanted intermodulation products. To achieve both inherently conflicting characteristics, it is necessary to use external amplifier circuits, which have a high space requirement and cost.

To reduce the space requirement and the cost, it has been proposed that digitally operating control amplifiers (programmable gain amplifier PGA) be used as the input amplifier, this amplifier controlling its gain in adjustable stages and also advantageously having a very low noise factor. As a result, despite a very low input level, a good signal-to-noise ratio is ensured. However, amplifiers of this type have the drawback that when the gain setting changes, as a result of static level fluctuations, an abrupt level change appears on the output signal. This abrupt level change is corrected by the second amplifier stage only slowly on account of the time constant. In the case of digitally modulated signals, this can result in additional bit errors on account of incorrect amplitude values. To prevent the second amplifier from being readjusted, therefore, the output signal from the digital first control amplifier is masked out during the digital first control amplifier's switching operation. This means that continuous transmission is not possible however, or gaps appear in the data stream. For these reasons, amplifier systems comprising digital and analog control amplifiers have not been used to date.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a circuit arrangement and a method which allow continuous amplification.

The invention includes a circuit arrangement having a first amplification device having a digital input for controlling the gain and which has a second amplification device, connected in series therewith, likewise having an input for controlling the gain. In this arrangement, the two control inputs of the first and second amplification devices are connected to one another such that a change in the actuating signal of the first amplification device in one direction prompts control of the gain of the second amplification device in the opposite direction.

By applying an actuating signal to the control input of the two amplification devices, a useful signal is amplified in the circuit arrangement using a defined factor. A change of gain in the first amplification device via the control input is used to change the gain of the second amplification device in the opposite direction such that the total gain of the circuit arrangement remains essentially the same. This ensures a continuous gain even during a stepped change in the gain of the first device.

One embodiment of the invention is for the control input of the second amplification device to be in the form of an analog input. The digital level signal of the first amplification device is converted into an analog signal using a digital-analog converter and is supplied to the control input of the second amplification device.

As a further embodiment, the output of the first amplification device may have a level detector which, following a level comparison with an upper and a lower limit value, outputs a corresponding signal.

In this exemplary embodiment, it is particularly advantageous if the circuit arrangement further comprises a setting apparatus coupled to the control input of the amplification device. The setting apparatus uses the signal which is output via the level detector in order to generate a setting signal comprising n bits for controlling the amplification device.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a schematic diagram illustrating an amplifier arrangement in accordance with one embodiment of the present invention.

DETAILED DESCRIPTION OF THE INVENTION

The text below explains the invention in detail using an exemplary embodiment with reference to FIG. 1.

The inventive circuit arrangement has a first digital control amplifier DA having an input 1, an output 2 and a digital control input 3. The output 2 of the amplifier DA is connected to a device for frequency conversion UDC. This device has a capacitor C for isolating the useful signal path from the DC path, a frequency converter M1, a filter F1, a frequency converter M2, a bandpass filter F2 and also an amplification device having a fixed gain A1 and a further filter F3. The filters F1 and F3 are in the form of SAW filters with a fixed frequency.

The output of the device for frequency conversion is connected to a second amplification device AA, which is likewise in the form of a control amplifier. The amplifier AA has an analog control input 5 which is connected to a voltage source V. At the output of the amplification device AA, the received and frequency-converted signal is amplified again and is then tapped off.

The digital control input 3 of the amplification device DA is routed to a setting apparatus CNT and also to a device DAC which comprises at least one digital-analog converter. The output of the converter DAC is connected to a summing circuit SC which sums the output signal from the converter DAC and the voltage signal from the amplification device A3 operating as a voltage source and supplies the sum to the control input 5 of the amplification device AA. The control input 5 of the amplification device AA is also connected to a comparison arrangement TOP which has a comparison input 8 with a signal comprising 8 bits and also an output 9, whose signal comprises 2 bits.

At the output of the amplification device AA, which is connected to a further amplifier A2, it is possible to tap off the frequency-converted signal, which is measured by the level detection device OLD. The output of the detection device OLD controls the input of an amplifier A3. To this end, the device OLD uses an external prescribed or an internal value. It is thus possible for, by way of example, the demodulation device to monitor a voltage value when required which can be a control target. The amplifier A3 is connected to the summing circuit SC and thus controls a portion of the control voltage at the input of the amplification device AA such that the desired peak-to-peak voltage value of the useful signal can be tapped off at the output of the amplification device A2. If appropriate, the control voltage can be measured at the output V.

The device for frequency conversion UDC also has two connecting nodes 6 and 7 which are connected to the level detectors WLD and ILD. Both level detectors have a reference input 8 for which a reference level is prescribed. The outputs 9 of the level detectors WLD and ILD and also of the arrangement TOP, which have a signal comprising two bits, are connected to a pilot or control circuit GC. The pilot circuit CG also has the inputs CLK, S1 and S2. The input CLK is used to supply a clock signal. The inputs S1 and S2 are used for external control of the entire circuit arrangement. The pilot circuit contains a logic arrangement, for example an FPGA, PLD or else an ASIC which processes the input signals.

The pilot circuit GC also has an output 10 which is routed to the input of the setting apparatus CNT. The signal from the output 10 has a word length of several bits from which the device CNT ascertains the setting for the digital control. In the present example, this is 5 bits. 2 bits of this signal are used, in one example, for transmitting an instruction to increase, to reduce or to maintain the previous gain. The other bits, in this example, can be used to turn off the device CNT or to put it back into a defined state. The device CNT checks the bits of the setting signal 10 coming from the pilot device preferably upon a rising or falling edge of a clock signal CLK applied to the input 11 and thus controls the setting signal for the control input 3 of the device DA.

In the illustrative example shown (which is in no respect limited, however), the signal at the output 12 of the setting apparatus CNT has a word length of 3 bits, which results in 8 possible settings at the control input 3 of the control amplifier DA. The maximum gain of the amplifier DA is +7 dB, which decreases in 4 dB steps down to −21 dB. The setting is chosen such that the bit sequence 000, that is to say the lowest possible state, corresponds to the largest gain stage +7 dB. The highest bit sequence corresponds to the lowest gain stage of −21 dB. Naturally, it is possible to swap this order, to implement a nonlinear profile for the gain stages or to alter the distance between stages, and such variations are contemplated by the present invention.

A useful signal applied to the input 1 is amplified in the device DA using a factor which is prescribed by the control input 3, the useful signal arriving at the connecting node 6 and at the input of the level detector WLD. The latter compares the signal level with an upper and a lower limit value which is applied to the input 8. The upper and lower limit values are provided by a digital signal comprising 8 bits in the present example.

At the output 9, the level detector WLD outputs a control signal comprising two bits, which, depending on the result of the comparison, is intended to signal an increase in the gain in the amplification device DA, a maintaining of the gain or a reduction in the gain. The word length of the output signal from the level detector WLD is not limited to two bits in this case. With a larger word length at the output 9 of the level detector, this can also be done by concurrently sending the difference from a nominal value.

If the signal is too low, for example, and hence the signal-to-noise ratio is too small, a signal for increasing the power is sent to the pilot circuit GC. The pilot device GC processes this signal and, for its part, sends a signal for increasing the gain to the setting apparatus CNT. Upon the next edge of the clock signal CLK, the setting apparatus CNT lowers the bit sequence by one bit and as a result raises the gain by 4 dB in the control amplifier DA. The type of digital actuating signal is dependent on the control input 3 of the amplification device. It may be a parallel signal or a serial actuating signal.

It is equally possible in another embodiment of the invention for the pilot device GC to send the setting apparatus CNT not just a signal for changing but also for it to transmit a value for how many stages the change is intended to involve. This means that not just a sequential change as in the exemplary embodiment shown is possible, but also direct setting of the gain of the first amplification device DA is contemplated by the invention.

At the same time, the setting signal coming from the output 12 of the apparatus CNT is converted to an analog voltage signal by the device DAC. By lowering the digital signal by one bit, the voltage signal at the output of the converter DAC thus also becomes smaller. As a result, the control voltage at the input 5 of the analog amplifier AA falls, with the total gain of the entire arrangement remaining the same, however. This simultaneous readjustment reduces the abrupt signal change which occurs as a result of the abrupt change in the gain in the device DA.

Following the level detector WLD, the wideband RF signal passes through a mixer M1 which is used to convert it to a first intermediate frequency. The mixing device M1 has a tunable local oscillator (not shown) since the frequency band used is variable and the unwanted frequency bands are rejected by a fixed filter F1.

Following the selection, the signal is converted to a second intermediate frequency using a device for frequency conversion M2, intermodulation products are removed by a bandpass filter F2, and the filtered signal is again amplified by a fixed factor using the amplification device A1.

To ensure an optimum gain for the RF signal before and after the frequency conversion and filtering, besides the level detector WLD, another level detector ILD, which is of the same design in one example, is provided which compares the level of the frequency-converted signal at point 7 with an upper and a lower limit value.

At the output of the level detector ILD, it is possible to tap off the same signals as are also at the output of the detector WLD. This signal is likewise used to set the device CNT using the pilot device GC. The RF signal converted to the second intermediate frequency has secondary products removed from it again by a filter F3 and is supplied to the analog amplification device AA.

The two level detectors WLD and ILD, firstly, are intended to prevent the formation of intermodulation products that may otherwise be caused by overdriving the input of the mixers M1, M2 and filters F1, F2. Secondly, they detect an excessively small signal-to-noise ratio. To this end, they are advantageously designed in one example for a continuous comparison. Alternatively, a discrete-time level comparison is also conceivable, however, for example with the clock signal of the signal CLK. Instead of the comparison by the level detectors which has been described, however, other comparison circuits are also conceivable, for example with just one limit value, and such alternatives are contemplated by the present invention.

The detector TOP, which compares the control signal from the control input 5 with a prescribed limit value, is used to set a limit value up to which control by the detectors WLD and ILD is possible.

One idea behind the invention is thus compensation for a change of gain in a digital control element by a corresponding change in a second amplification device, so that the abrupt signal change occurring in the digital amplification device is reduced and the total gain remains essentially the same. This can be achieved by connecting a control unit to the control inputs of the amplification device. The second amplification device may be either in the form of an analog amplification device or in the form of a digital amplification device. In the latter case, there is naturally no need to provide means for digital-analog conversion. Besides a voltage signal, a current signal is also conceivable as the signal for the analog actuating input.

In the embodiment presented, a 1-bit increase in the actuating signal produces a reduction in the voltage of the converted analog signal. An inverter can thus be dispensed with. Depending on other conceivable embodiments, additional circuit elements for controlling both amplification devices may therefore be employed in accordance with the central idea behind the invention.

The inventive circuit arrangement is not limited to amplifying received signals in this case. The compensating circuit described is also conceivable for a transmission arrangement or for general circuits for signal amplification with a plurality of amplification devices.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A circuit arrangement, comprising:

first and second adjustable amplification devices, wherein a signal output of the first amplification device is coupled to a signal input of the second amplification device, and wherein the first amplification device comprises a digital control amplifier having a control input, and the second amplification device has a control input for controlling a gain thereof;

a control unit coupled to the control inputs of the first and second amplification devices, and configured to provide control signals thereto such that a change in the gain of the second amplification device in one direction is effected by a change in gain in the first amplification device in the opposite direction; and a level detection device connected to the signal output of the first amplification device, and configured to perform a level comparison of the signal output with an upper and a lower limit value, and output a comparison signal at an output thereof, and provide the comparison signal to the control circuit.

2. The circuit arrangement of claim 1, wherein the second amplification device comprises an analog amplification device, and further comprising at least one digital-analog converter configured to convert a digital amplification control signal comprising a word length of n bits from the control unit into an analog amplification control voltage signal.

3. The circuit arrangement of claim 1, further comprising a frequency conversion circuit arranged between the first amplification device and the second amplification device.

4. The circuit arrangement of claim 3, further comprising a level detection device connected to the output of the frequency conversion device, and configured to compare the output signal to one or more prescribed values and output a comparison signal for evaluation by the control unit in response thereto.

5. The circuit arrangement of claim 1, further comprising a setting apparatus for controlling a gain, and configured to generate a gain control signal comprising n bits in order to set the gain, and wherein the control gain control signal is connected to the control input of the first amplification device.

6. The circuit arrangement of claim 5, wherein the setting apparatus comprises an input for receiving a control signal from the control circuit, and generating the gain control signal in response thereto.

7. The circuit arrangement of claim 1, wherein the control input of the first amplification device is configured to receive a control signal comprising a word length of n bits.

8. A receiver circuit, comprising:

a digital control adjustable amplifier configured to receive an analog input signal and generate a first amplified signal based on a digitally adjustable gain associated therewith;

a frequency converter device configured to receive the first amplified signal and generate a frequency converted signal;

an analog control adjustable amplifier configured to receive the frequency converted signal and generate a second amplified signal based on an analog adjustable gain associated therewith; and a control unit configured to evaluate signal conditions of the receiver circuit and generate first and second control signals for the digital control adjustable amplifier and the analog control adjustable amplifier in response thereto, respectively, wherein the first control signal dictates a change in gain of the digital control adjustable amplifier in a first gain direction, and the second control signal dictates a change in gain of the analog control adjustable amplifier in a second, opposite direction, wherein the control unit comprises:

a level detector circuit configured to evaluate the first amplified signal or the frequency converted signal and generate an evaluation result signal in response thereto; and a control circuit configured to receive the evaluate result signal and generate the first and second control signals in response thereto.

9. The receiver circuit of claim 8, wherein the control circuit comprises:

a pilot circuit configured to receive the evaluation result signal and generate an internal control signal in response thereto;

a setting apparatus configured to generate the first control signal in response to the internal control signal; and a digital to analog converter configured to receive the first control signal and convert it to an analog signal, thereby generating the second control signal.

10. The receiver circuit of claim 9, further comprising a summation circuit configured to add a compensation component to the analog signal to form the second control signal.

11. The receiver circuit of claim 10, further comprising a compensation circuit configured to evaluate the output of the receiver circuit, and generate the compensation component in response thereto.

12. The receiver circuit of claim 9, wherein the pilot circuit is further configured to evaluate the second control signal and modify the internal control signal in response thereto.

13. A method for compensating for abrupt signal level changes in an amplification device, comprising:

applying a first digital actuating signal to a control input of a first digital control amplifier;

converting the first digital actuating signal into a second analog actuating signal, which is applied to a control input of a second amplification device;

wherein a change in the actuating signal at the control input of the first amplification device alters a gain thereof and prompts a change in a gain in the opposite direction at the input of the second amplification device such that the total gain of the two amplification devices remains essentially the same; and comparing a level of the output signal from one or both amplification devices with an upper limit, a lower limit, or both, and altering the first and second actuating signals in response thereto.

* * * * *